United States Patent [19]
Altoz

[11] Patent Number: 5,329,420
[45] Date of Patent: Jul. 12, 1994

[54] SLOTTED TUNING FORK THERMAL INTERFACE

[76] Inventor: Frank E. Altoz, 311 Stonewall Rd., Catonsville, Md. 21228

[21] Appl. No.: 486,673

[22] Filed: Feb. 28, 1990

[51] Int. Cl.⁵ .............................................. H05K 7/20
[52] U.S. Cl. ................................... 361/709; 165/80.3; 211/41; 361/796
[58] Field of Search .................. 211/41; 361/382–388, 361/415, 355, 379; 165/80.2, 80.3, 80.4, 185; 174/16.3, 252

[56] References Cited

U.S. PATENT DOCUMENTS

| | | | |
|---|---|---|---|
| 3,738,422 | 6/1973 | Economos et al. | 165/80 |
| 4,157,582 | 6/1979 | Myers | 361/355 |
| 4,301,493 | 11/1981 | Schweikle | 361/355 |
| 4,583,149 | 4/1986 | Ohlenburger | 361/387 |
| 4,790,374 | 12/1988 | Jacoby | 165/185 |
| 4,867,235 | 9/1989 | Grapes | 361/388 |
| 4,899,255 | 2/1990 | Case | 361/386 |

Primary Examiner—Gerald P. Tolin

[57] ABSTRACT

A chassis is provided having a heat conductive side wall together with a flat heat conductive tab member extending therefrom, together with a planar heat sink for supporting a heat generating electrical device, the heat sink having a pair of flat, parallel, resilient prongs and including first and second flat inner surfaces facing each other and separated from each other by a distance slightly greater than the thickness of the tab to form a clearance gap, together with a pair of wedge clamps for squeezing said prongs together to produce a good thermal contact between the prongs and the tab member. A narrow slot is formed within the heat sink for enhancing the resiliency of the prongs to enable easy actuation of the clamps.

30 Claims, 1 Drawing Sheet

SLOTTED TUNING FORK THERMAL INTERFACE

STATEMENT OF GOVERNMENT INTEREST

The invention described herein may be manufactured and used by or for the Government for governmental purposes without the payment of any royalty thereon.

BACKGROUND OF THE INVENTION

The use of standard electronic modules in future electronic systems places stringent requirements on the thermal interfacing of these units to their ultimate heat sink. As presently configured, the modules are thermally coupled to the chassis side walls containing the heat transfer surfaces through engaging tab extensions, and pressure created by standard type wedge clamps. This technique is satisfactory in designs where the heat flux at the mating surfaces is under 10 watts/in$^2$. Control of the machine finish on each surface to better than 32 micro inch and flatness variations of under 0.001 inch per inch per surface together with proper dimensional tolerancing of parts result in acceptable temperature gradients across these interfaces. An expression defining this gradiant for surfaces described above and with pressures in excess of 30 psi is:

$$\Delta T = 0.5\phi$$

where $\phi$ = flux, watts/in$^2$
and
$\Delta T$ = interface delta, °C.

On one type of interface, a 20 watt module results in an interface delta of only 5° C. (each tab area is 1 in$^2$). However, the introduction of higher power modules such as low voltage power supply units creates flux densities at tab interfaces which far exceed 10 watts/in$^2$. For these units, it is necessary to increase the number of tabs or the engaging surface area to limit the gradient. A typical arrangement is shown in FIG. 1, where the module heat Q passes internally to the engaging tabs on each end and into the finned heat exchanger walls. The temperature gradient across the interface with this type configuration is an unacceptable 21° C. based on a 100 watt module heat dissipation and an interface area of 1.2 in$^2$ (0.22×5.5") at each end.

SUMMARY OF THE PREFERRED EMBODIMENT OF THE INVENTION

A planar heat sink for supporting the module, terminates in a pair of flat, parallel, resilient prongs including first and second inner surfaces facing each other, forming a clearance gap with respect to the tab. A clamping arrangement is utilized for squeezing the prongs together to produce a good thermal contact between the inner surfaces of the prongs and the top and bottom surfaces of the tab member. The planar heat sink also includes a narrow slot for enhancing the resiliency of the prongs. There is no manual insertion force required to insert the heat sink about the tab due to the aforesaid clearance. This arrangement also is compact relative to an alternative design of increasing the area of the tab for a single thermal interface surface.

Other objects, features and advantages of the present invention will become apparent upon study of the following description taken in conjunction with drawings in which:

FIG. 1 illustrates the aforesaid prior art arrangement;
FIG. 2 illustrates a preferred embodiment of the thermal interface of the invention; and
FIGS. 3 and 4 illustrate alternate embodiments of the two-prong terminal portion of the heat sink.

DETAILED DESCRIPTION

Figure 1:
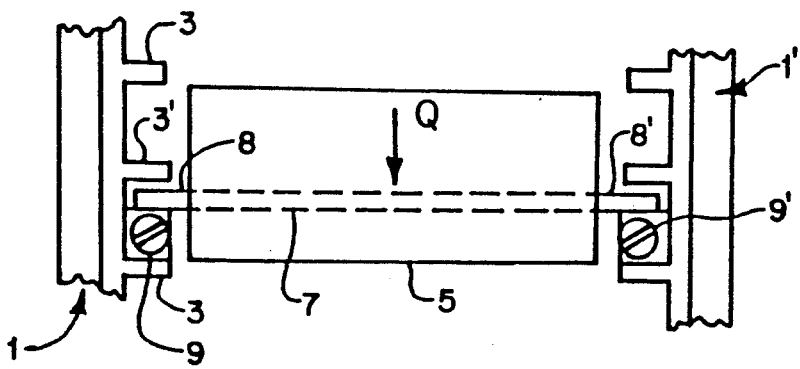

FIG. 1 illustrates a first side wall portion 1 and a second side wall portion 1' which may be finned and/or cooled by air or liquid. The aforesaid module 5 is supported by a planar heat sink plate 7, which terminates at portion 8 which in turn rests upon a conventional wedge clamp 9 supported by tab 3, as shown. The opposite end of the heat sink is supported by wedge clamp 9' at terminal portion 8'. The gap between the terminal portion 8 and a second tab member 3' is closed by actuating wedge clamp 9 to cause terminal portion 8 to press against tab 3'. This prior art arrangement has the disadvantages as set forth hereinabove. A cooling liquid or gas may flow through the heat dissipating side wall if needed.

Figure 2:
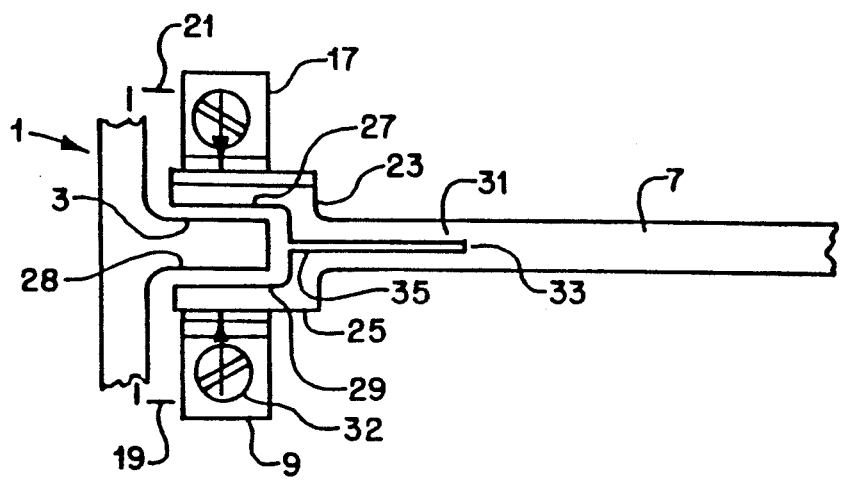

In the embodiment of the invention, illustrated in FIG. 2, the clamping means comprises two conventional wedge type clamps 9 and 17, clamp 9 being rigidly coupled to side wall unit 1 as indicated by dashed line 19. In like manner, upper wedge clamp 17 is rigidly affixed to the side wall heat dissipating member 1 as indicated by the dashed line 21. Lower wedge clamp 9 is actuated to force the upper surface 29 of the lower prong 25 against the lower surface 28 of tab 3. Next, wedge clamp 17 is actuated to force the lower surface 27 of the upper prong 23 downwardly against the upper surface of tab 3 so that the flat, parallel, resilient prongs, grip upper and lower surfaces of tab 3 to produce the aforesaid enhanced rate of heat flow into the heat dissipating side wall member 1. A narrow slot 31 is formed in the central portion of planar heat sink 7, as shown, which enhances the resiliency of the prongs to ease manual actuation of the wedge clamps.

Copper or aluminum are suitable heat transfer materials utilized in the apparatus of the invention. In the final preferred design, the total clearance between the thickness of tab 3 and the distance between inner prong surfaces 27 and 29 was 5 mils. The narrow slot 31 had a thickness of 10 mils and a length of about 0.45 inches. The thickness of the heat sink 7 was about 0.125 inches. It may be noted that since the narrow slot 31 has a thickness of only 10 mils, the thermal conductance in the heat sink is only reduced by about 5%, or less than 0.5° C. for fifty watts along the 0.45 inch length of slot 31, which length extends from first slot portion 33 to second terminal portion 35 of the slot. In other words, the 10 mil thickness of the narrow slot 31, perpendicular to its length, provides good resiliency of prongs 23 and 25 and yet does not substantially reduce the thermal conductance of heat sink 7 in the area adjacent the prongs.

Thus, a compact thermal interface apparatus is provided which substantially increases the flow rate of heat out of heat sink 7 by utilizing both sides of tab 3 and the resiliency of the prongs enable them to be easily and rapidly affixed about tab 3 to make a good pressurized thermal contact of the flat surfaces of the prongs with respect to the tab. The conventional wedge clamps are actuated with a screwdriver for turning a screw 32 which in turn produces translation of a first wedge which could coact with a second wedge having a complementary surface to force the second wedge upwardly, to actuate the prong member to close the aforesaid gap. Other types of clamps could be employed to squeeze the resilient prongs together about tab 3.

Figure 3:
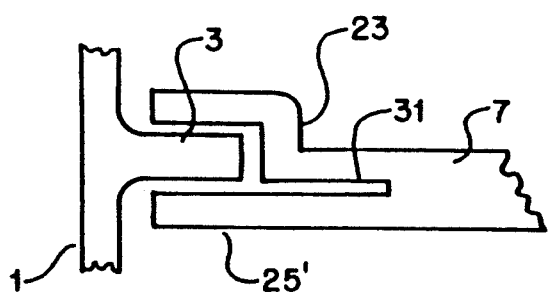
Figure 4:
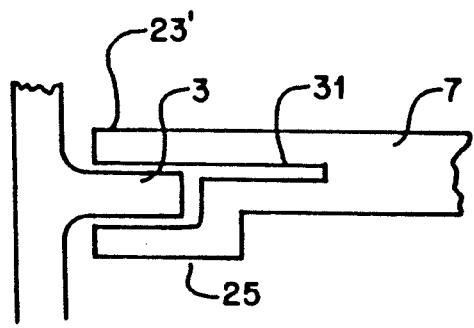

As indicated in FIG. 3, the lower prong member could be flat as indicated at 25' and the narrow slot 31 for enhancing resiliency could be aligned with the lower tab gap. In a similar manner, as shown in FIG. 4, the upper prong 23' could be flat and the narrow slot 31 could be aligned with the upper gap between upper prong 23' and tab 3.

While preferred embodiments of the present invention have been described, numerous variations will be apparent to the skilled worker in the art, and thus the scope of the invention is to be restricted only by the terms of the following claims and art recognized equivalents thereof.

What is claimed is:

1. Thermal heat sink interface apparatus comprising:
   (a) heat dissipating means together with a flat heat conductive tab member extending therefrom;
   (b) a heat sink having a heat generating electrical device thereon, said heat sink having a pair of flat parallel, resilient prongs including first and second inner surfaces facing each other and separated from each other by a distance slightly greater than the thickness of said tab member to form a clearance gap; and
   (c) clamping means for squeezing said prongs together to produce a good thermal contact between the first and second inner surfaces of said prongs and said tab member.

2. The apparatus of claim 1 including a narrow slot formed within said heat sink for enhancing the resiliency of said prongs.

3. The apparatus of claim 2 wherein said narrow slot has a thickness only slightly greater than the clearance gap so as not to substantially reduce the thermal conductivity of said heat sink.

4. The apparatus of claim 3 wherein said narrow slot has a thickness of about 10 mils.

5. The apparatus of claim 3 wherein said narrow slot has a length of about 0.45 inches.

6. The apparatus of claim 4 wherein said narrow slot has a length of about 0.45 inches.

7. The apparatus of claim 2 wherein said clearance gap is about 5 mils.

8. The apparatus of claim 3 wherein said clearance gap is about 5 mils.

9. The apparatus of claim 4 wherein said clearance gap is about 5 mils.

10. The apparatus of claim 5 wherein said clearance gap is about 5 mils.

11. The apparatus of claim 6 wherein said clearance gap is about 5 mils.

12. The apparatus of claim 3 wherein said heat sink has a thickness of about 0.125 inches.

13. The apparatus of claim 4 wherein said heat sink has a thickness of about 0.125 inches.

14. The apparatus of claim 4 wherein said heat sink is planar and has a thickness of about 0.125 inches.

15. The apparatus of claim 5 wherein said heat sink is planar and has a thickness of about 0.125 inches.

16. The apparatus of claim 6 wherein said heat sink is planar and has a thickness of about 0.125 inches.

17. The apparatus of claim 7 wherein said heat sink is planar and has a thickness of about 0.125 inches.

18. The apparatus of claim 1 wherein said heat sink is made of metal selected from the group consisting of copper and aluminum.

19. The apparatus of claim 2 wherein said heat sink is made of metal selected from the group consisting of copper and aluminum.

20. The apparatus of claim 3 wherein said heat sink is made of metal selected from the group consisting of copper and aluminum.

21. The apparatus of claim 4 wherein said heat sink is made of metal selected from the group consisting of copper and aluminum.

22. The apparatus of claim 5 wherein said heat sink is made of metal selected from the group consisting of copper and aluminum.

23. The apparatus of claim 6 wherein said heat sink is made of metal selected from the group consisting of copper and aluminum.

24. Thermal heat sink interface apparatus comprising:
   (a) a chassis having a heat conductive side wall together with a flat heat conductive tab member extending therefrom;
   (b) a planar heat sink for supporting a heat generating electrical device thereon, said heat sink having a pair of flat parallel, resilient prongs configured in the manner of a tuning fork and including first and second flat inner surfaces facing each other and separated from each other by a distance slightly greater than the thickness of said tab member to form a clearance gap; and
   (c) clamping means for squeezing said prongs together to produce a good thermal contact between the first and second inner surfaces of said prongs and said tab member.

25. The apparatus of claim 24 including a narrow slot formed within said heat sink adjacent said prongs for enhancing the resiliency of said prongs.

26. The apparatus of claim 25 wherein said narrow slot has a thickness only slightly greater than the clearance gap so as not to substantially reduce the thermal conductivity of said planar heat sink.

27. The apparatus of claim 26 wherein said narrow slot has a thickness of about 10 mils.

28. The apparatus of claim 26 wherein said narrow slot has a length of about 0.45 inches.

29. The apparatus of claim 27 wherein said narrow slot has a length of about 0.45 inches.

30. The apparatus of claim 28 wherein said clearance gap is about 5 mils.

* * * * *